United States Patent
Chen et al.

(10) Patent No.: US 6,893,936 B1
(45) Date of Patent: May 17, 2005

(54) METHOD OF FORMING STRAINED SI/SIGE ON INSULATOR WITH SILICON GERMANIUM BUFFER

(75) Inventors: Huajie Chen, Danbury, CT (US); Stephen W. Bedell, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/710,255

(22) Filed: Jun. 29, 2004

(51) Int. Cl.[7] .................................................. H01L 21/76
(52) U.S. Cl. ........................ 438/407; 438/456; 438/910
(58) Field of Search ................................ 438/406, 407, 438/455, 458, 459, 910

(56) References Cited

U.S. PATENT DOCUMENTS

| | | | | |
|---|---|---|---|---|
| 5,374,564 A | * | 12/1994 | Bruel | ......................... 438/455 |
| 5,882,987 A | * | 3/1999 | Srikrishnan | .................. 438/407 |
| 6,059,895 A | * | 5/2000 | Chu et al. | ................... 148/33.1 |
| 6,524,935 B1 | | 2/2003 | Canaperi et al. | ............. 438/458 |
| 6,573,126 B2 | * | 6/2003 | Cheng et al. | ................ 438/149 |
| 6,603,156 B2 | | 8/2003 | Rim | ........................... 257/190 |
| 6,633,066 B1 | * | 10/2003 | Bae et al. | .................... 257/347 |
| 6,812,116 B2 | * | 11/2004 | Huang et al. | ................ 438/458 |

* cited by examiner

*Primary Examiner*—Chandra Chaudhari
(74) *Attorney, Agent, or Firm*—Margaret A. Pepper

(57) ABSTRACT

A method is disclosed for forming a semiconductor wafer having a strained Si or SiGe layer on an insulator layer. The method produces a structure having a SiGe buffer layer between the insulator layer and the strained Si or SiGe layer, but eliminates the need for Si epitaxy after bonding. The method also eliminates interfacial contamination between strained Si and SiGe buffer layer, and allows the formation of Si/SiGe layers having a total thickness exceeding the critical thickness of the strained Si layer.

20 Claims, 6 Drawing Sheets

METHOD OF FORMING STRAINED SI/SIGE ON INSULATOR WITH SILICON GERMANIUM BUFFER

BACKGROUND OF INVENTION

This invention relates to integrated circuit (IC) structures and processes that include a strained silicon or silicon germanium (Si/SiGe) layer. More particularly, this invention relates to formation of a structure having a strained Si/SiGe layer on an insulator layer which is useful for fabricating high speed devices such as complementary metal-oxide-semiconductor (CMOS) transistors and other metal-oxide-semiconductor field effect transistor (MOSFET) applications.

Electron and hole mobility in strained silicon or silicon germanium layers has been shown to be significantly higher than that in bulk silicon. For example, measured values of electron mobility in strained Si at room temperature are about 3000 $cm^2/Vs$ as opposed to 400 $cm^2/Vs$ in bulk silicon. Similarly, hole mobility in strained SiGe with high Ge concentration (60%~80%) reaches up to 800 $cm^2/Vs$, which is about 5 times the hole mobility in bulk silicon of 150 $cm^2/Vs$. MOSFETs with strained-Si channels have been experimentally demonstrated to have enhanced device performance compared to devices fabricated in conventional (unstrained) silicon substrates. Potential performance improvements include increased device drive current and transconductance, as well as the added ability to scale the operation voltage without sacrificing circuit speed in order to reduce the power consumption.

Strained-Si layers are the result of biaxial tensile stress induced in silicon grown on a substrate formed of a material whose lattice constant is greater than that of silicon. The lattice constant of germanium is about 4.2 percent greater than that of silicon, and the lattice constant of a silicon-germanium alloy is nearly linear with respect to its germanium concentration. As a result, the lattice constant of a SiGe alloy containing fifty atomic percent germanium is about 1.02 times greater than the lattice constant of silicon. Epitaxial growth of silicon on such a SiGe substrate will yield a silicon layer under tensile strain, with the underlying SiGe substrate being essentially unstrained, or "relaxed." A structure and process that realize the advantages of a strained-Si channel structure for MOSFET applications are taught in commonly-assigned U.S. Pat. No. 6,059,895, which discloses a technique for forming a CMOS device having a strained-Si channel on a SiGe layer, all on an insulating substrate.

The underlying conducting substrate for MOSFETs and bipolar transistors or the interaction of the underlying substrate with the active device regions in CMOS are undesirable features which limit the full performance of high speed devices. To resolve the problem, in Si technology, an insulating layer is usually used to isolate the active device region from the substrate, by creating Silicon-On-insulator (SOI) wafers to replace bulk Si material for device fabrication. Available technology to achieve SOI wafers includes Separation by Implanted Oxygen (SIMOX), bonding and etch-back Silicon-On-Insulator (BESOI), separation by implanted hydrogen also known as the Smart-Cut® process which is described in U.S. Pat. No. 5,374,564, or the combination of the last two processes for making ultra-thin SOI, described in U.S. Pat. No. 5,882,987.

When Si in an SOI wafer is substituted by strained Si or SiGe (Si/SiGe) layers for high speed applications, two methods are generally used to produce strained Si/SiGe-on-insulator structures. In one method, thermal mixing is used to produce a relaxed SiGe-on-insulator structure (SGOI), followed by epitaxial growth of strained Si on SGOI. This thermal mixing method is illustrated in FIGS. 1(a)–(c). A SiGe layer 13 is deposited on an SOI substrate comprising silicon substrate 10, insulator or oxide layer 11 and silicon layer 12, as shown in FIG. 1(a). Thermal mixing is then performed, to produce the structure shown in FIG. 1(b) which comprises substrate 10, insulator layer 11, and SiGe layer 14. During thermal mixing, germanium is rejected from the oxide during high temperature oxidation, and the final SiGe concentration and relaxation in layer 14 is a function of the initial SiGe concentration in layer 13, its thickness, and the final thickness of SiGe layer 14. Following thermal mixing, oxide is stripped from the top surface of the structure. Finally, strained Si layer 15 is grown on SiGe layer 14, as shown in FIG. 1(c).

While thermal mixing is a promising method to make strained Si/SiGe-on-insulator, it has draw backs. In the thermal mixing method, a SiGe-on-insulator structure is first formed, then strained Si is grown on the SiGe. Strained Si deposition on SiGe may leave a non-ideal interface with O and C residue, which may affect device performance or yield. In addition, SiGe after thermal mixing is usually not fully relaxed. In order to achieve high strain in the strained Si, high concentration SiGe is needed as the template for strained Si growth. The high concentration SiGe will lead to integration complexity and potentially yield degradation.

The other method generally used to produce strained Si/SiGe on insulator structures involves wafer bonding. Specifically, a first wafer bonding method involves bonding relaxed SiGe onto an insulator followed by strained Si/SiGe growth. This first wafer bonding method is described in U.S. Pat. No. 6,524,935, and is illustrated in FIGS. 2(a)–2(d). The method begins with growing an epitaxial relaxed SiGe layer 21 on a first silicon substrate 20, as shown in FIG. 2(a). Next, hydrogen is implanted into the SiGe layer 21 to form a hydrogen-rich defective layer (not shown). The surface of the SiGe layer 21 is smoothed by chemical-mechanical polishing (CMP). Then, the surface of the first substrate is bonded to the surface of a second substrate comprising bulk silicon 22 and an insulator layer 23, as shown in FIG. 2(b). Specifically, the smoothed surface of the SiGe layer 21 is bonded to the insulator layer 23, which is typically $SiO_2$. Bonding the two substrates together is accomplished by placing the surface of the first substrate against the surface of the second substrate resulting in a weak chemical bond which holds the two substrates together. A thermal treatment is usually performed to the bonded wafer pair to strengthen the chemical bonds at the joined interface. Following bonding, the two substrates are separated at the hydrogen-rich defective layer, resulting in the structure shown in FIG. 2(c) which comprises second substrate 22, insulator layer 23 and a portion of SiGe layer 21. The top surface of SiGe layer 21 in this separated structure may be smoothed by CMP. Finally, in FIG. 2(d), strained Si layer 24 is epitaxially grown on SiGe layer 21.

This wafer bonding method suffers from process complications. The as-bonded SiGe on insulator is usually too thick, and therefore thinning of SiGe is required before strained Si deposition, which is a non-trivial process. In addition, strained Si deposition on SiGe may leave a non-ideal interface with O and C residue, which may affect device performance or yield.

A second wafer bonding method involves directly bonding strained Si/SiGe onto an insulator. This second wafer bonding method is described in U.S. Pat. No. 6,603,156, and is illustrated in FIGS. 3(a)–3(e). The method begins with growing a relaxed SiGe layer 31 on a first silicon substrate 30, as shown in FIG. 3(a). A strained-Si layer 32 is next formed on strain-inducing SiGe layer 31, as shown in FIG. 3(b). Then, the first substrate is bonded to a second substrate comprising bulk silicon 33 and an insulator layer 34, as shown in FIG. 3(c). Specifically, the two structures are bonded such that the insulating layer 34 is between strained-Si layer 32 and second substrate 33, and the strained-Si layer 32 directly contacts the insulating layer 34, as shown in FIG. 3(d). The initial strain-inducing layer 31 is then removed to expose the surface of the strained-Si layer 32 and yield a strained-Si-on-insulator (SSOI) structure. Strain-inducing layer 31 may be removed by CMP, wafer cleaving (smart cut), or chemical etching. A chemical etching process such as HHA (hydrogen peroxide, hydrofluoric acid, and acetic acid) selective to Si is preferred so that the SiGe layer 31 is fully removed stopping on the strained-Si layer 32.

This second wafer bonding method eliminates the steps of thinning of SiGe and the interface left by strained-Si growth on SiGe, as needed by the first wafer bonding method. U.S. Pat. No. 6,603,156 also teaches that a structure without SiGe between the strained-Si and the insulator is advantageous, as SiGe usually complicates CMOS processes. However, with strained-Si directly on insulator, the thickness of Si is limited due to the critical thickness of the strained layer. For example, strained-Si with 1% of strain is limited to a thickness of about 100 Å, beyond which defects may form in the strained-Si during high temperature process steps. The critical thickness of Si with higher strain is even less. Given that current CMOS technologies require various Si thicknesses for SOI structures, there is a need in the art for a method of forming strained SOI or SGOI structures having the required total Si/SiGe thickness without exceeding the critical thickness of the strained layer.

SUMMARY OF INVENTION

The aforementioned deficiencies of the prior art methods for forming a strained Si/SiGe-on-insulator structure are alleviated through use of the method of the present invention, in which a SiGe buffer is added in between the strained layer and the insulator to achieve the required total Si/SiGe thickness without exceeding the critical thickness of the strained layer.

Specifically, the invention is directed to a method of forming a strained $Si_{1-y}Ge_y$ layer above an insulator layer. The method comprises the steps of: forming a relaxed $Si_{1-x}Ge_x$ layer on a first crystalline semiconductor substrate; forming a strained $Si_{1-y}Ge_y$ layer on said relaxed $Si_{1-x}Ge_x$ layer; forming a $Si_{1-z}Ge_z$ layer on said strained silicon layer; forming a hydrogen-rich defective layer in said relaxed $Si_{1-x}Ge_x$ layer; providing a second crystalline semiconductor substrate having an insulator layer thereover; bonding a top surface of said $Si_{1-z}Ge_z$ layer on said first substrate to said insulator layer on said second substrate; separating said relaxed $Si_{1-x}Ge_x$ layer at said hydrogen-rich defective layer to form a structure comprising said second substrate with said insulator layer, said $Si_{1-z}Ge_z$ layer on said insulator layer, said strained $Si_{1-y}Ge_y$ layer on said $Si_{1-z}Ge_z$ layer, and a portion of said relaxed $Si_{1-x}Ge_x$ layer on said strained $Si_{1-y}Ge_y$ layer; and removing said portion of said relaxed $Si_{1-x}Ge_x$ layer.

BRIEF DESCRIPTION OF DRAWINGS

The features of the invention believed to be novel and the elements characteristic of the invention are set forth with particularity in the appended claims. The drawings are for illustration purposes only and are not drawn to scale. Furthermore, like numbers represent like features in the drawings. The invention itself, however, both as to organization and method of operation, may best be understood by reference to the detailed description which follows, taken in conjunction with the accompanying drawings, in which:

DETAILED DESCRIPTION

The invention will now be described by reference to the accompanying figures. In the figures, various aspects of the structures have been shown and schematically represented in a simplified manner to more clearly describe and illustrate the invention. For example, the figures are not intended to be drawn to scale. In addition, the vertical cross-sections of the various aspects of the structures are illustrated as being rectangular in shape. Those skilled in the art will appreciate, however, that with practical structures these aspects will most likely incorporate more tapered features. Moreover, the invention is not limited to constructions of any particular shape.

Figure 1A:
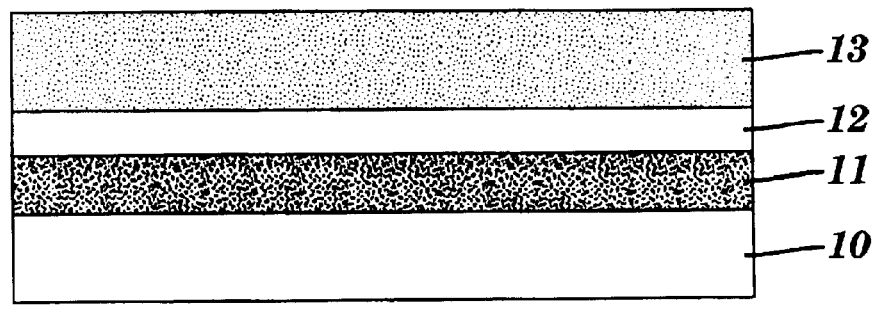
FIGS. 1(a)–1(c) illustrate a prior art method for forming a strained Si/SiGe-on-insulator structure using thermal mixing.
Figure 1B:
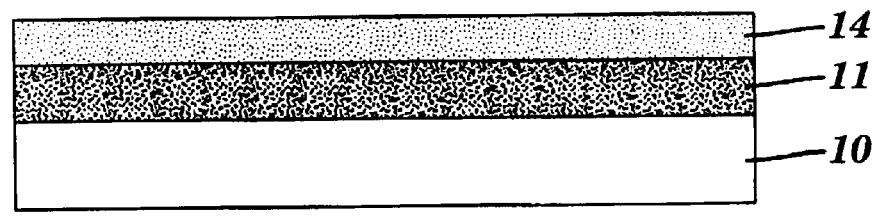
Figure 1C:
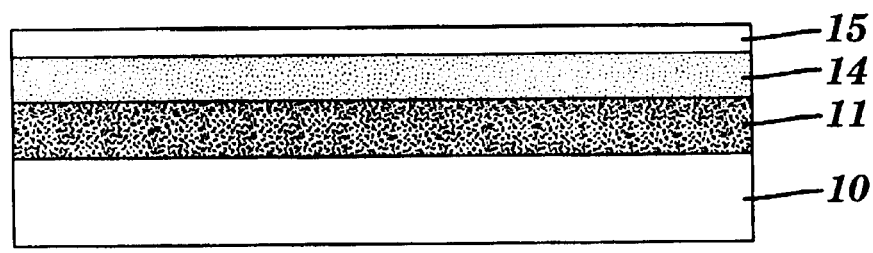
Figure 2A:
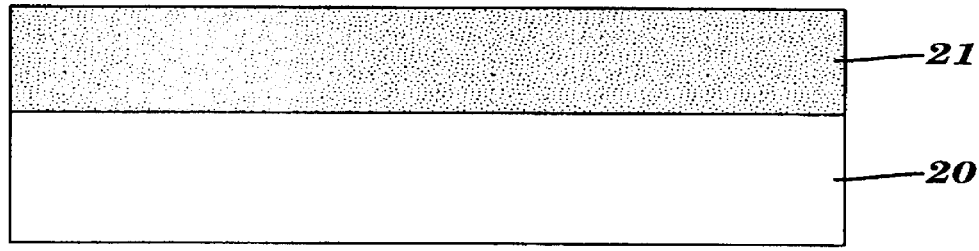
FIGS. 2(a)–2(d) illustrate a prior art method for forming a strained Si/SiGe-on-insulator structure using a first wafer bonding method which involves bonding relaxed SiGe onto an insulator and then growing strained Si/SiGe.
Figure 2B:
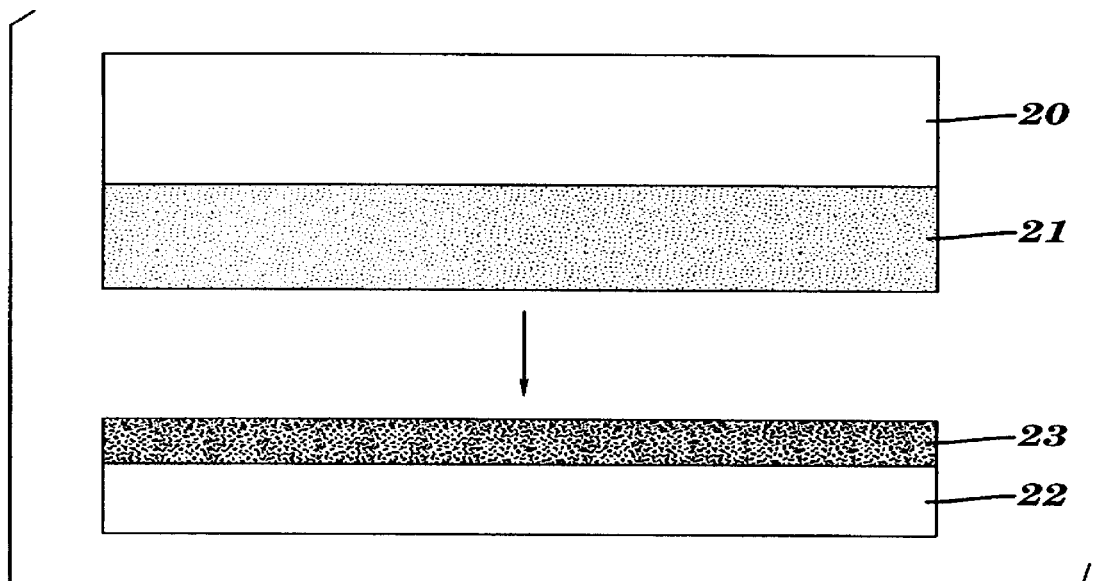
Figure 2C:
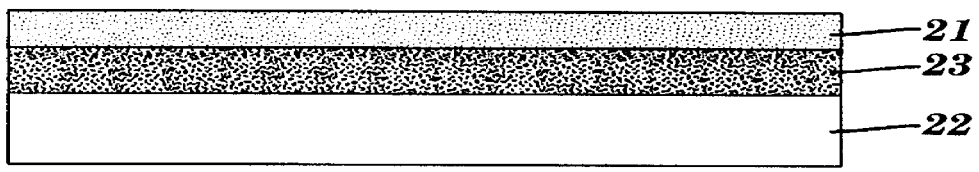
Figure 2D:
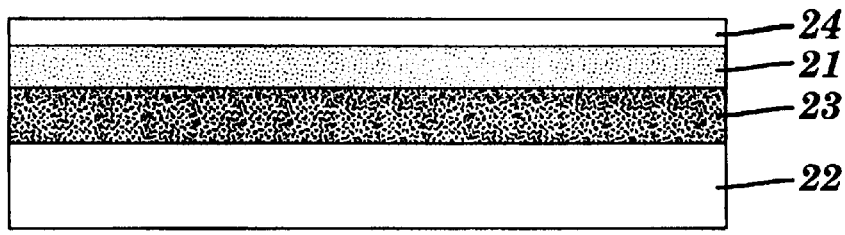
Figure 3A:
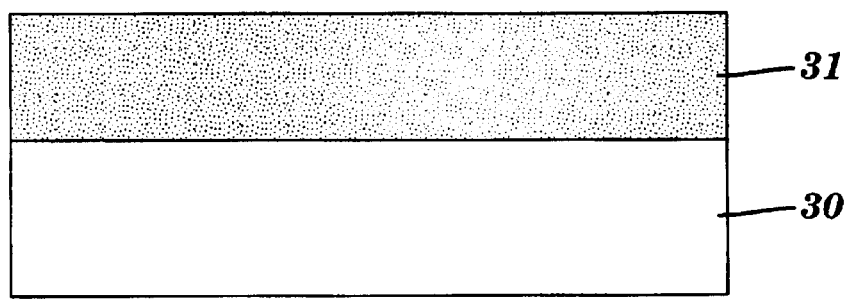
FIGS. 3(a)–3(e) illustrate a prior art method for forming a strained Si-on-insulator structure using a second wafer bonding method which involves directly bonding strained Si onto an insulator.
Figure 3B:
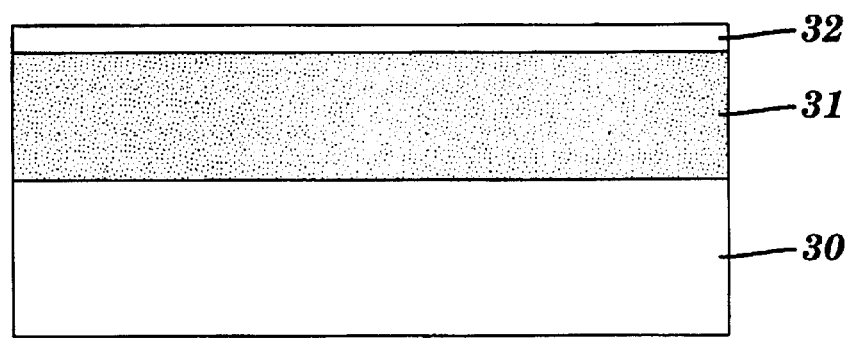
Figure 3C:
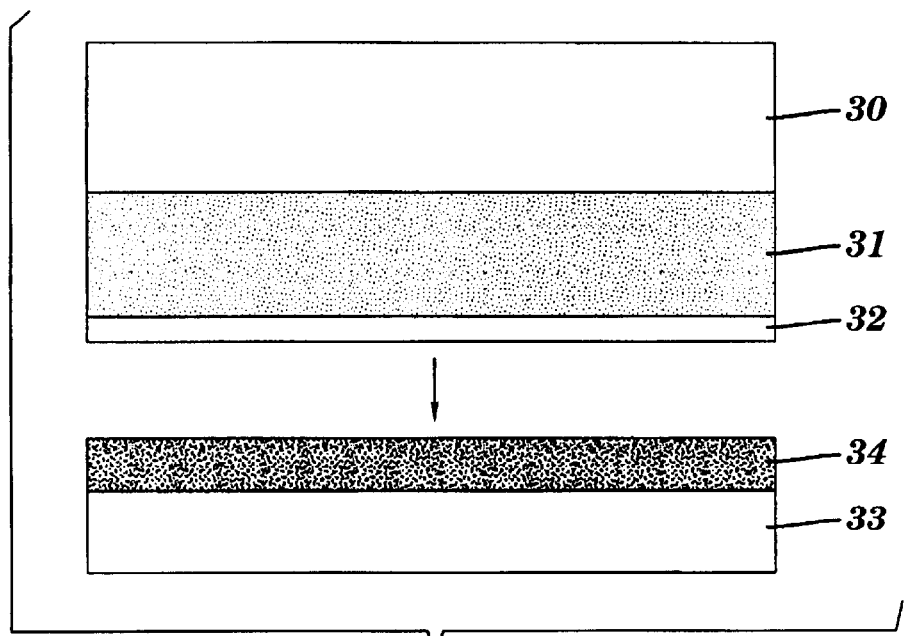
Figure 3D:
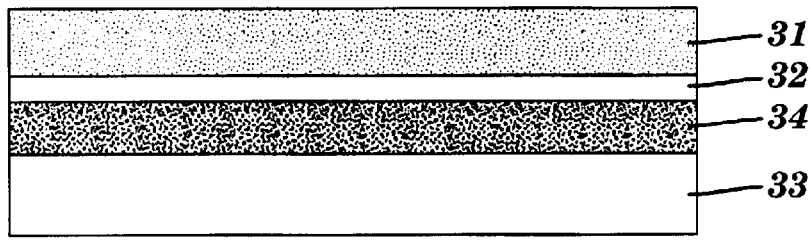
Figure 3E:
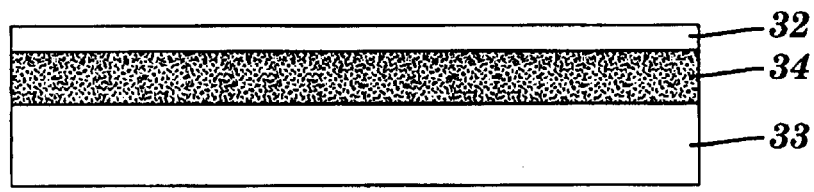
Figure 4A:
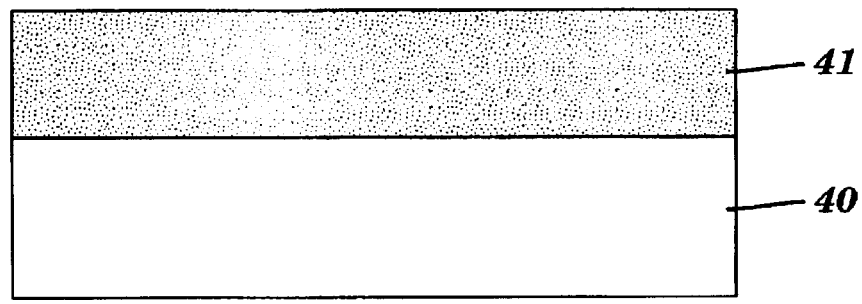
FIGS. 4(a)–4(f) illustrate a preferred embodiment of the method of the present invention for forming a strained Si/SiGe-on-insulator structure.

A preferred embodiment of the method of the present invention is illustrated in FIGS. 4(a)–4(f). The method begins with formation of a relaxed $Si_xGe_x$ layer 41 on a first crystalline semiconductor substrate 40, as shown in FIG. 4(a). First substrate 40 may be any single crystal material suitable for forming epitaxial layers thereon. Examples of such suitable single crystal materials include Si, SiGe, SiGeC and SiC, with Si being preferred.

The upper surface of layer 41 should be substantially relaxed or completely relaxed. The relaxation may be due to a modified Frank-Read mechanism as described in U.S. Pat. No. 5,659,187, the disclosure of which is incorporated herein by reference. Layer 41 may be formed by growing a relatively thick graded SiGe layer followed by a constant concentration SiGe layer having a total thickness of greater than 1 μm, where the SiGe is fully or partially relaxed, followed by CMP smoothing. Alternatively, layer 41 may be formed by growing a medium thickness SiGe layer having a thickness of about 500 to 3000 Å, followed by He implant and anneal, and CMP smoothing if necessary.

The concentration x of Ge in layer 41 may range from about 0.05 up to about 1.0, and is preferably in the range of about 0.15 to about 0.40.

Figure 4B:
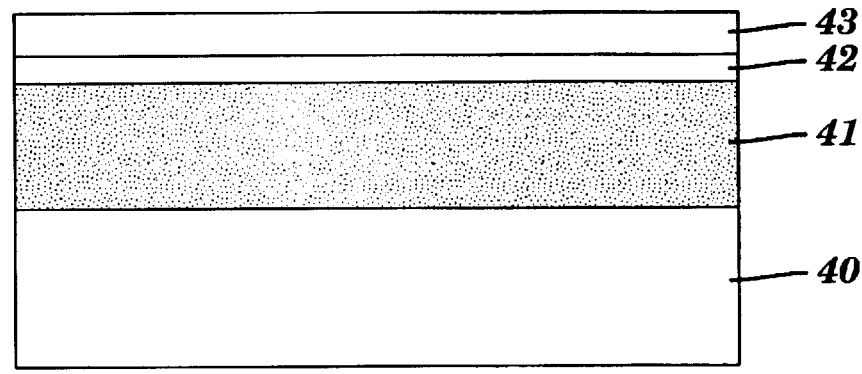

Next, a strained $Si_{1-y}Ge_y$ layer 42 is grown epitaxially on the top surface of layer 41, and then a $Si_{1-z}Ge_z$ layer 43 is grown on top of strained layer 42, as shown in FIG. 4(b). The concentration y of Ge in layer 42 may range from zero up to 0.05. The concentration y in layer 42 should be less than the concentration x in layer 41, such that layer 41 has a greater lattice constant than layer 42, thereby forming a strained layer 42 which is under biaxial tension. In a preferred embodiment, concentration y in layer 42 is zero, such that layer 42 is a strained-Si layer. Layer 42 preferably has a thickness of about 50 Å to about 300 Å. The thickness of layer 42 is related to the strain in the film. For higher strain, the thickness of layer 42 should be smaller to avoid film relaxation and additional defect formation in the film.

$Si_{1-z}Ge_z$ layer 43 may be strained or unstrained, depending on the concentration z of Ge and the process needs. Specifically, the concentration z may range from about 0.05 to about 1.0, more preferably about 0.10 to about 0.30, and may be less than or greater than the concentration x of Ge in layer 41. The thickness of $Si_{1-z}Ge_z$ layer 43 may be selected so that the total thickness of layers 42 and 43 is as required by the specific CMOS technology needs. In a preferred embodiment, layer 43 may have a thickness of about 50 Å to about 600 Å, more preferably about 100 Å to about 300 Å.

$Si_{1-z}Ge_z$ layer 43 may be epitaxially grown following growth of the strained $Si_{1-y}Ge_y$ layer 42, preferably without taking the wafer out from the epitaxy chamber, so that the interface between $Si_{1-z}Ge_z$ layer 43 and strained $Si_{1-y}Ge_y$ layer 42 is clean.

Figure 4C:
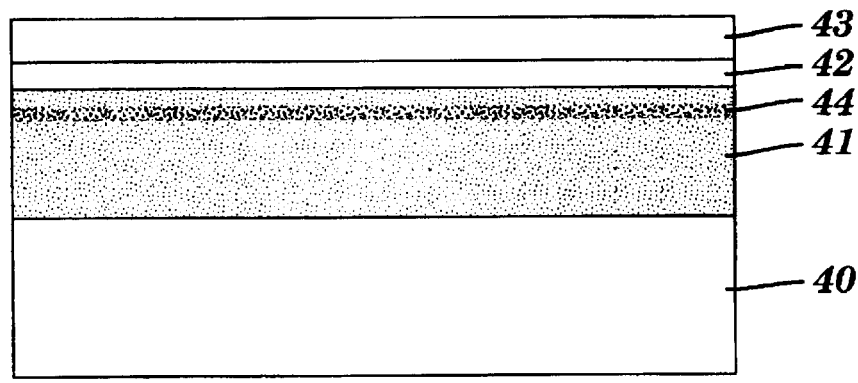

Next, a hydrogen implantation step is performed to form a hydrogen-rich defective layer 44, as shown in FIG. 4(c). Specifically, layer 41 is subjected to ion bombardment or the implantation of hydrogen ions, which may be implanted at an energy of about 10 KeV to about 200 KeV at a dose of about $5\times10^{16}$ to about $1\times10^{17}$ ions/cm$^2$. The hydrogen implantation results in the formation of a hydrogen-rich layer 44 comprising hydrogen-containing SiGe point defects and planar micro cracks residing in principle crystallographic planes of SiGe. The energy of the hydrogen ions is selected to place the peak dose in layer 41 below the top surface of layer 41, preferably at a depth of about 100 nm to 1000 nm. The hydrogen-rich defective layer 44 will form at the peak dose location of hydrogen.

Figure 4D:
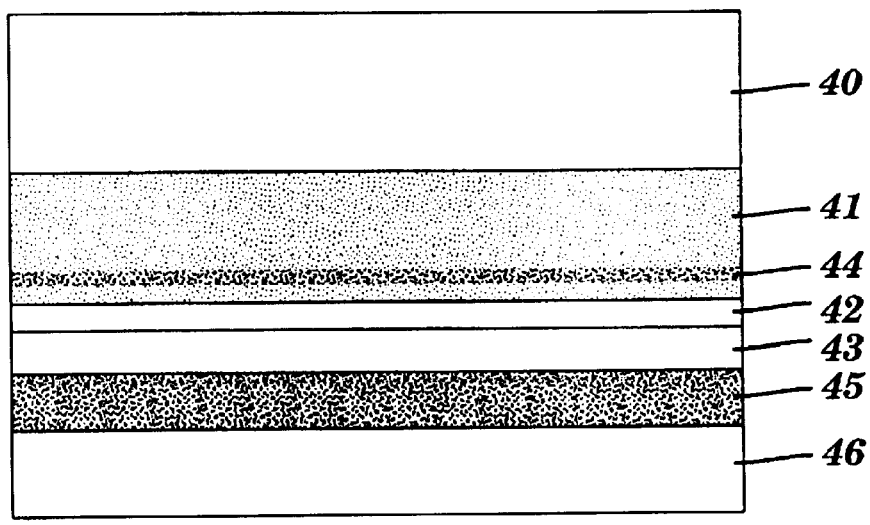
Figure 4E:
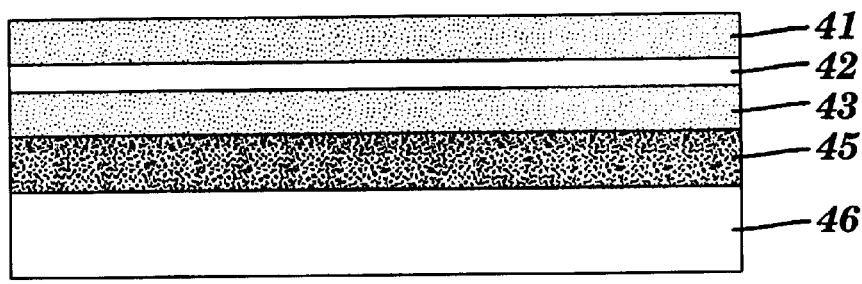
Figure 4F:
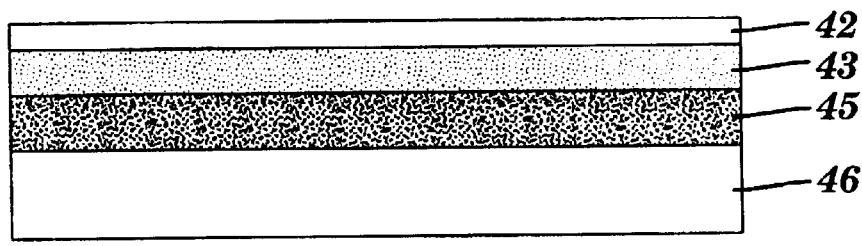

After forming hydrogen-rich defective layer 44, the first structure comprising layers 40, 41, 42 and 43 is bonded to a second structure comprising layers 45 and 46, as shown in FIG. 4(d). Specifically, second structure comprises substrate 46 and insulating layer 45. Suitable materials for substrate 46 include single-crystal silicon, polysilicon, SiGe, GaAs and other III–V semiconductors, with single-crystal silicon being particularly preferred. The insulating layer 45 may be formed of any suitable material, including silicon oxide (SiO$_2$), silicon nitride (SiN) and aluminum oxide (Al$_2$O$_3$), although other electrically insulating materials could be used, including silicon oxynitride, hafnium oxide (HfO$_2$), zirconium oxide (ZrO$_2$) and doped aluminum oxide. SiO$_2$ is particularly preferred for insulating layer 45. While the individual thicknesses of insulating layer 45 and substrate 46 are not generally critical to the invention, thicknesses of up to about 1 µm are suitable for the insulating layer 45.

The first structure may be bonded to the second structure using any suitable wafer bonding technique. Prior to wafer bonding, the top surface of layer 43 may be polished by a touch up Chemical Mechanical Polishing (CMP) process to provide a smooth top surface if necessary, with minimum removal of film in layer 43. This polishing may be performed before or after formation of hydrogen-rich defective layer 44. This top surface of layer 43 shown in FIG. 4(c) then may be turned upside down and brought into contact with the top surface of layer 45. The bonding between the surfaces of layers 43 and 45 may be strengthened by annealing at a temperature of about 50° C. to about 500° C., for a time period of about 2 hours to about 50 hours.

Layer 41 is then separated at the hydrogen-rich defective layer 44 by any suitable technique, without disturbing the mechanical bond between layers 43 and 45. For example, layer 41 may be separated into two portions by annealing, preferably at a temperature of about 200° C. to about 600° C. After separation, the remaining structure comprises substrate 46, insulating layer 45, $Si_{1-z}Ge_z$ layer 43, strained $Si_{1-y}Ge_y$ layer 42, and a portion of relaxed $Si_{1-x}Ge_x$ layer 41, a shown in FIG. 4(e).

It is possible at this point to perform an optional bond strengthening anneal at a temperature between 500° C. to 900° C. for a period of time ranging from a few seconds (using rapid thermal annealing) to 3 hours. The purpose of this anneal is to both strengthen the bonds at the joined interface as well as remove any residual hydrogen which may interfere with the subsequent selective removal of the remaining portion of layer 41.

Finally, the remaining portion of layer 41 is removed by any suitable method, preferably by selective etch such as using HHA stopping on strained layer 42. The resulting structure, shown in FIG. 4(f), comprises substrate 46, insulating layer 45, $Si_{1-z}Ge_z$ buffer layer 43, and strained $Si_{1-y}Ge_y$ layer 42. The interface between strained $Si_{1-y}Ge_y$ layer 42 and $Si_{1-z}Ge_z$ buffer layer 43 is clean, as the two films were grown in the same epitaxy step.

The process steps of the present invention are similar to the method described in U.S. Pat. No. 6,603,156, with the addition of $Si_{1-z}Ge_z$ layer 43 on top of strained $Si_{1-y}Ge_y$ layer 42 before wafer bonding. As a result, a strained Si/SiGe on SiGe on insulator structure similar to that disclosed in U.S. Pat. No. 6,524,935 is obtained, but without the need for non-trivial SiGe thinning and no contaminated interface between strained layer 42 and underlying 43.

An alternative embodiment would allow the possibility of a SiGe buffer when epitaxially growing $Si_{1-y}Ge_y$ on $Si_{1-x}Ge_x$. This may be used for better growth of strained Si on SiGe. The SiGe buffer may have a Ge concentration of x, or less than x, and preferably the SiGe buffer is lattice matched to $Si_{1-x}Ge_x$. For example, when x is 0.3 and is 90% relaxed, then the SiGe buffer has a Ge concentration of 0.27.

Another alternative embodiment would allow the possibility of having an insulator layer on top of $Si_{1-z}Ge_z$ before wafer bonding, instead of or in addition to having it on the second substrate, similar to U.S. Pat. No. 6,603,156.

While the present invention has been particularly described in conjunction with a specific preferred embodiment and other alternative embodiments, it is evident that numerous alternatives, modifications and variations will be apparent to those skilled in the art in light of the foregoing description. It is therefore intended that the appended claims embrace all such alternatives, modifications and variations as falling within the true scope and spirit of the present invention.

What is claimed is:

1. A method for forming a strained $Si_{1-y}Ge_y$ layer above an insulator layer, the method comprising the steps of:

forming a relaxed $Si_{1-x}Ge_x$ layer on a first crystalline semiconductor substrate;

forming a strained $Si_{1-y}Ge_y$ layer on said relaxed $Si_{1-x}Ge_x$ layer;

forming a $Si_{1-z}Ge_z$ layer on said strained $Si_{1-y}Ge_y$ layer;

forming a hydrogen-rich defective layer in said relaxed $Si_{1-x}Ge_x$ layer;

providing a second crystalline semiconductor substrate having an insulator layer thereover;

bonding a top surface of said $Si_{1-z}Ge_z$ layer on said first substrate to said insulator layer on said second substrate;

separating said relaxed $Si_{1-x}Ge_x$ layer at said hydrogen-rich defective layer to form a structure comprising said second substrate with said insulator layer, said $Si_{1-z}Ge_z$ layer on said insulator layer, said strained $Si_{1-y}Ge_y$ layer on said $Si_{1-z}Ge_z$ layer, and a portion of said relaxed $Si_{1-x}Ge_x$ layer on said strained $Si_{1-y}Ge_y$ layer; and removing said portion of said relaxed $Si_{1-x}Ge_x$ layer.

2. The method of claim 1, wherein said first crystalline semiconductor substrate comprises a material selected from the group consisting of Si, SiGe, SiGeC and SiC.

3. The method of claim 1, wherein said relaxed $Si_{1-x}Ge_x$ layer is formed by a method comprising the steps of:

growing a graded layer of SiGe;

growing a constant concentration layer of SiGe on said graded layer of SiGe; and smoothing said constant concentration layer of SiGe using chemical mechanical polishing.

4. The method of claim 1, wherein said relaxed $Si_{1-x}Ge_x$ layer is formed by a method comprising the steps of:

growing a layer of SiGe;

implanting He into the substrate with said layer of SiGe; and annealing said layer of SiGe.

5. The method of claim 1, wherein said relaxed $Si_{1-x}Ge_x$ layer has a Ge concentration x of about 0.05 to about 1.0.

6. The method of claim 5, wherein said relaxed $Si_{1-x}Ge_x$ layer has a Ge concentration x of about 0.15 to about 0.40.

7. The method of claim 1, wherein said strained $Si_{1-y}Ge_y$ layer is grown epitaxially on said relaxed $Si_{1-x}Ge_x$ layer.

8. The method of claim 1, wherein said strained $Si_{1-y}Ge_y$ layer has a Ge concentration y of 0 to 0.05.

9. The method of claim 8, wherein said strained $Si_{1-y}Ge_y$ layer has a Ge concentration y of 0.

10. The method of claim 1, wherein said Ge concentration y is less than said Ge concentration x.

11. The method of claim 1, wherein said $Si_{1-z}Ge_z$ layer is grown epitaxially on said strained $Si_{1-y}Ge_y$ layer.

12. The method of claim 1, wherein said $Si_{1-z}Ge_z$ layer has a Ge concentration z of about 0.05 to about 1.0.

13. The method of claim 12, wherein said $Si_{1-z}Ge_z$ layer has a Ge concentration z of about 0.10 to about 0.30.

14. The method of claim 1, wherein said hydrogen-rich defective layer is formed by implanting hydrogen ions into said relaxed $Si_{1-x}Ge_x$ layer.

15. The method of claim 1, wherein said second crystalline semiconductor substrate comprises a material selected from the group consisting of single-crystal silicon, polysilicon, SiGe and GaAs.

16. The method of claim 1, wherein said insulator layer comprises a material selected from the group consisting of silicon oxide, silicon nitride, aluminum oxide, silicon oxynitride, hafnium oxide, zirconium oxide and doped aluminum oxide.

17. The method of claim 1, further comprising, prior to said bonding step, the step of polishing the top surface of said $Si_{1-z}Ge_z$ layer.

18. The method of claim 1, wherein said top surface of said $Si_{1-z}Ge_z$ layer is bonded to said insulator layer by a method comprising the step of:

annealing at a temperature of about 50° C. to about 500° C., for a time period of about 2 hours to about 50 hours.

19. The method of claim 1, wherein said said relaxed $Si_{1-x}Ge_x$ layer at said hydrogen-rich defective layer is separated by a method comprising the step of:

annealing at a temperature of about 200° C. to about 600° C.

20. The method of claim 1, wherein said portion of said relaxed $Si_{1-x}Ge_x$ layer is removed by a method comprising the step of:

etching using hydrogen peroxide, hydrofluoric acid and acetic acid.

\* \* \* \* \*